US009185833B2

(12) United States Patent
Alshinnawi et al.

(10) Patent No.: US 9,185,833 B2
(45) Date of Patent: Nov. 10, 2015

(54) ELECTRONIC DEVICE HOUSING

(71) Applicant: LENOVO ENTERPRISE SOLUTIONS (SINGAPORE) PTE. LTD., Singapore (SG)

(72) Inventors: Shareef F. Alshinnawi, Apex, NC (US); Gary D. Cudak, Wake Forest, NC (US); Edward S. Suffern, Chapel Hill, NC (US); John M. Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 56 days.

(21) Appl. No.: 14/205,414

(22) Filed: Mar. 12, 2014

(65) Prior Publication Data

US 2015/0264843 A1    Sep. 17, 2015

(51) Int. Cl.
*H05K 9/00*  (2006.01)
*H05K 5/03*  (2006.01)
*H05K 5/00*  (2006.01)
*H01R 13/518*  (2006.01)

(52) U.S. Cl.
CPC ............ *H05K 9/0015* (2013.01); *H01R 13/518* (2013.01); *H05K 5/0026* (2013.01); *H05K 5/03* (2013.01); *H05K 9/0018* (2013.01)

(58) Field of Classification Search
CPC ... H01R 13/518; H05K 9/0015; H05K 9/0018
USPC ....................................... 312/223.1; 174/359
See application file for complete search history.

(56) References Cited

U.S. PATENT DOCUMENTS

| | | | |
|---|---|---|---|
| 4,802,605 A | | 2/1989 | Salmon et al. |
| 5,230,552 A | * | 7/1993 | Schipper et al. ........... 312/223.6 |
| 5,737,189 A | * | 4/1998 | Kammersgard et al. ...... 361/726 |
| 5,810,461 A | * | 9/1998 | Ive et al. .................... 312/223.6 |
| 6,788,544 B1 | * | 9/2004 | Barsun et al. .................. 361/727 |
| 7,407,392 B2 | * | 8/2008 | Cooke et al. .................. 439/131 |
| 7,639,486 B2 | | 12/2009 | Champion et al. |
| 7,878,888 B2 | | 2/2011 | Rasmussen et al. |
| 2006/0018622 A1 | * | 1/2006 | Caveney et al. .............. 385/135 |
| 2006/0082979 A1 | * | 4/2006 | Brandl et al. .................. 361/729 |
| 2007/0165618 A1 | | 7/2007 | Niazi et al. |
| 2008/0002937 A1 | * | 1/2008 | Spisany et al. ................ 385/135 |
| 2008/0062655 A1 | * | 3/2008 | Laursen et al. ............... 361/733 |
| 2008/0106871 A1 | * | 5/2008 | James ........................... 361/727 |
| 2010/0248535 A1 | * | 9/2010 | Chern et al. .................. 439/544 |
| 2010/0267251 A1 | * | 10/2010 | Phu ................................ 439/49 |
| 2012/0292267 A1 | | 11/2012 | Goldenberg et al. |
| 2014/0354131 A1 | * | 12/2014 | Takeuchi et al. ........... 312/319.7 |

FOREIGN PATENT DOCUMENTS

| | | | |
|---|---|---|---|
| EP | 1777563 A1 | 4/2007 | |
| EP | 2239607 A1 | 10/2010 | |

* cited by examiner

*Primary Examiner* — Hung V Ngo
(74) *Attorney, Agent, or Firm* — Edward J. Lenart; Katherine S. Brown; Kennedy Lenart Spraggins LLP

(57) ABSTRACT

Embodiments of the present invention provide an apparatus allowing for an adjustable face plate. The apparatus comprises a face plate, an adjustment device affixed to the face plate, wherein the adjustment device includes a plurality of ridges formed thereon to define a plurality of gaps, and wherein the adjustment device is capable of rotating about an axis, and a clamp affixed to an electronic device chassis, having a first arm contacting the adjustment device in a first gap of the plurality of gaps and allowing for rotation of the adjustment device about the axis from the first gap to a second gap of the plurality of gaps.

20 Claims, 6 Drawing Sheets

ELECTRONIC DEVICE HOUSING

FIELD OF THE INVENTION

The present invention relates generally to the field of electronic device housings, and more specifically to adjustable electronic device housings.

BACKGROUND OF THE INVENTION

Electronic devices require housing to protect sensitive systems from external factors such as moisture and dust. Additionally, housings serve to limit the amount of stray electromagnetic radiation entering or leaving the device. Excess stray electromagnetic radiation can interfere with electronic devices' operation and prevent proper operation of those devices. Traditional housing structures employ a rectangular box structure with the electronic device stored inside. The box structure includes six faces, typically made from metal or plastic, connected at right angles to each other. One or more of the faces typically include buttons, measurement displays, and/or input/output (I/O) ports for interfacing with other electronic devices. Dense platforms, such as high performance network servers, often include multiple electronic devices, each with its own rectangular housing, stored in a rack or cabinet, and interconnected to each other via cables, such as coaxial Ethernet cables.

SUMMARY

Embodiments of the present invention provide an apparatus allowing for an adjustable face plate. The apparatus comprises a face plate, an adjustment device affixed to the face plate, wherein the adjustment device includes a plurality of ridges formed thereon to define a plurality of gaps, and wherein the adjustment device is capable of rotating about an axis, and a clamp affixed to an electronic device chassis, having a first arm contacting the adjustment device in a first gap of the plurality of gaps and allowing for rotation of the adjustment device about the axis from the first gap to a second gap of the plurality of gaps.

Additional embodiments of the present invention provide for an apparatus allowing for an adjustable face plate. The apparatus comprises a face plate, an adjustment device affixed to the face plate, wherein the adjustment device includes a plurality of ridges formed thereon to define a plurality of gaps, and wherein the adjustment device is capable of rotating about an axis, and a clamp connected to an electronic device chassis by way of a track slide, wherein the clamp has a first arm contacting the adjustment device in a first gap of the plurality of gaps and allowing for rotation of the adjustment device about the axis from the first gap to a second gap of the plurality of gaps.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Embodiments of the present invention recognize that traditional, rectangular box housings for electronic devices, particularly in dense platform environments, generate issues when connecting multiple devices together with cables, such as Ethernet compliant cables. Traditional housings include port faces affixed to a housing chassis at ninety (90) degrees. Cables connect to port faces at 90 degrees as well, but often connect to other devices with port faces that may be parallel to the first port face (e.g., devices stacked vertically in a rack) or facing in different directions (e.g., devices stored in different racks or with port faces on different sides of the same rack). In order to ensure that cables do not break or suffer damage, cables are rated with a minimum bend radius which places a limit on how tightly the cables can be bent. As a result, systems need cables that are longer than the distance between the two ports to which the cables connect. Excess cables, particularly when wound into loops, add to the space required to create the desired system configuration. In high density systems where dozens of cables may interconnect multiple servers and switches, reducing the overall space occupied by the system can be a high priority in order to use space as efficiently as possible. Bulky, excess cables may also require modification of the system storage unit (e.g., removing a rack or cabinet door). Embodiments of the present invention disclose an electronic device housing having a rotating, adjustable port face for easier cable connection and avoidance of stressing cables.

Figure 1:
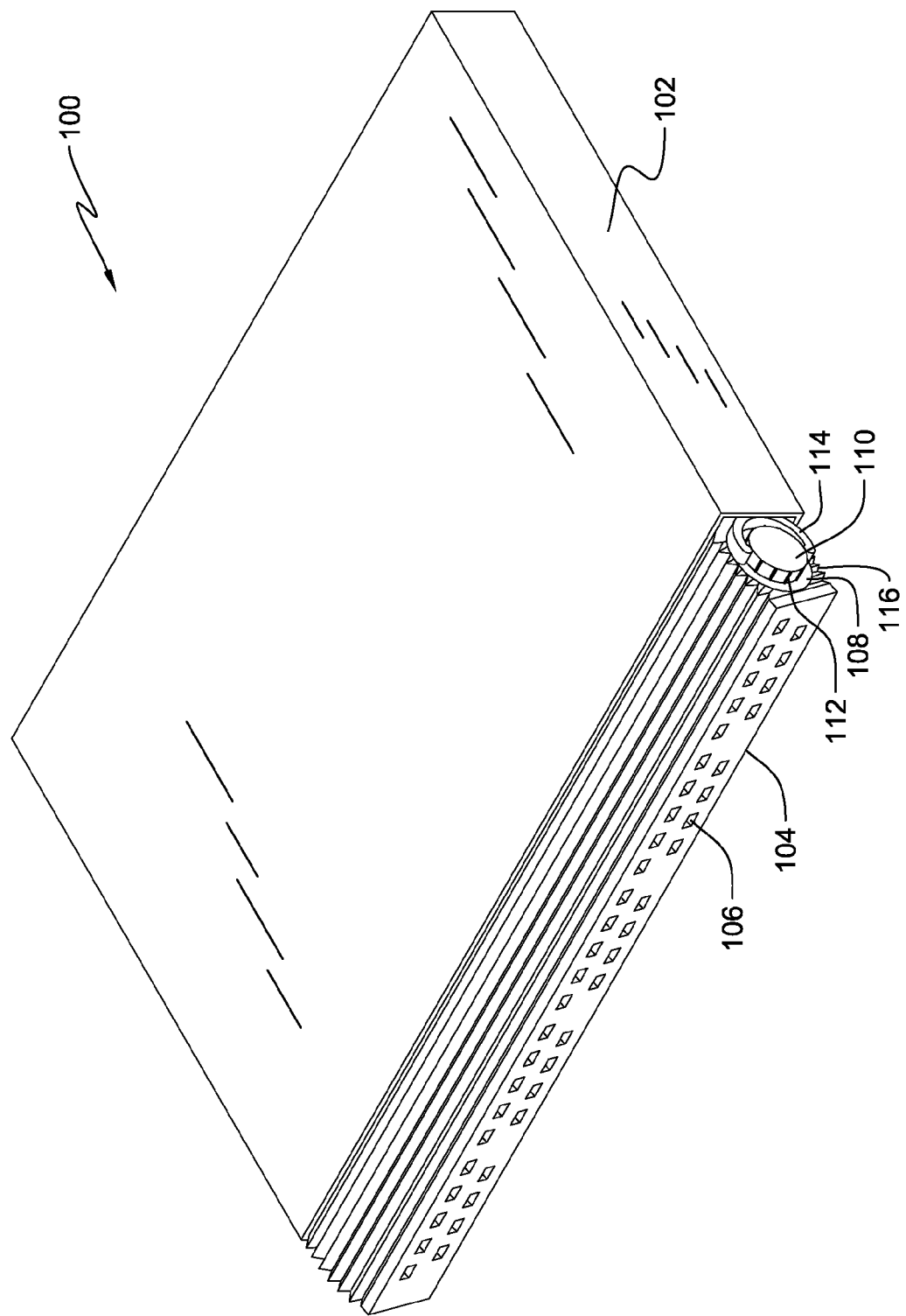
FIG. 1 is a perspective view of an electronic device housing with a rotationally adjustable port face, in accordance with an embodiment of the present invention.

The present invention will now be described in detail with reference to the Figures. FIG. 1 is a perspective view of an electronic device housing (housing), generally designated 100, with a rotationally adjustable port face, in accordance with an embodiment of the present invention. Housing 100 includes chassis 102, face plate 104, ports 106, disk 108, adjustment control 110, ridges 112, clamp 114, and electromagnetic compatibility (EMC) shielding 116. Chassis 102, face plate 104, disk 108, adjustment control 110, ridges 112, and clamp 114 may all be made from the same material, such as, aluminum or molded plastic.

Chassis 102 provides a mount and covering for various electronic components contained inside housing 100, such as printed circuit board(s) (PCBs), computer processors, computer storage devices, network connection hardware, cooling fans, and/or heat sinks. Chassis 102 can be made of any material that sufficiently protects the enclosed electronics from harmful external factors (e.g., moisture and dust) and provides EMC protection for nearby electronic devices. Examples of suitable chassis materials include, but are not limited to, aluminum and/or plastic. In one embodiment, chassis 102 is an elongated, hollow rectangular box having a top, bottom, three enclosed sides, and one open side.

Face plate 104 is a structure with a plurality of holes formed therethrough that facilitates access to the electronics enclosed in housing 100, via ports 106. In one embodiment, face plate 104 is the same size and shape as the sides of chassis 102. Face plate 104 has a top edge and a bottom edge. Ports 106 are input/output (I/O) connection points through which the electronics contained in housing 100 can connect to external electronic devices and systems. Ports 106 can be any type of connection point including power supply ports (e.g., AC or DC power) and/or data ports (e.g., Ethernet, parallel port, serial port, USB, and/or audio jack).

Disk 108 is a round structure that connects to face plate 104 and adjustment control 110, and facilitates the rotational motion of face plate 104. Disk 108 maintains a single point of contact with face plate 104 and rotates in conjunction with adjustment control 110 to various rotational angles. Each rotational angle corresponds to a different orientation for face plate 104. In some embodiments, disk 108 is a structure with a circular edge, with the interior face of face plate 104 affixed tangentially to the edge. In various embodiments, Disk 108 has an outer, flat surface that is substantially circular and lies parallel to a side of chassis 102 and perpendicular to face plate 104.

Adjustment control 110 is a substantially cylindrical structure that is fixed to the outer, flat surface of disk 108 and facilitates the rotation of disk 108 and face plate 104. Adjustment control 110 includes a substantially circular face that lies parallel to the outer, flat surface of disk 108. Adjustment control 110 includes a curved side that lies perpendicular to the outer, flat surface of disk 108. Adjustment control 110 includes a plurality of ridges, such as ridges 112, formed thereon at regular intervals on the curved side of adjustment control 110 and lying perpendicular to the substantially circular face. In various embodiments, adjustment control 110, ridges 112, and disk 108 are connected to form a single adjustment device.

Clamp 114 is a flexing mechanism fixed to a side of chassis 102 that compresses adjustment control 110 between ridges 112 in order to immobilize adjustment control 110 and hold face plate 104 at the desired angle. In various embodiments, clamp 114 can be a "circlip" ("C-Clip"), which is a type of fastener or retaining ring, consisting of a semi-flexible metal or plastic ring or semicircle with open ends which can be snapped into a machined groove, such as those defined by adjustment control 110 and ridges 112, to hold the object it surrounds in place. In other embodiments, clamp 114 can be a single arm, fixed to chassis 102 with a protrusion on the end thereof that fits into a gap defined by adjustment control 110 and ridges 112, and applies pressure to adjustment control 110 to hold faceplate 104 in place while allowing for rotation of adjustment control 110 when a torque is applied to face plate 104. In various embodiments, clamp 114 attaches to the interior of chassis 102.

In other embodiments, clamp 114 is slidably affixed to chassis 102. For example, a track can be affixed to the interior of chassis 102, a mounted wheel mechanism attached onto clamp 114, and the wheel inserted into the track mechanism to allow clamp 114 to slide into and out of the interior of chassis 102. As will be appreciated by one skilled in the art, the slidable mechanism can be any mechanism known in the art that would allow clamp 114 to slide into and out of chassis 102 without losing contact with adjustment control 110, or breaking an electromagnetic radiation seal created by EMC shielding 116.

EMC shielding 116 is a sheet of knitted wire mesh affixed to face plate 104 and to the top and bottom of chassis 104. EMC shielding 116 provides protection against electromagnetic radiation escaping from housing 100 or entering housing 100 from external sources, as well as protecting against dust contamination of the electronics stored in housing 100. In various embodiments, EMC shielding 116 includes one or more sheets of woven mesh made from nickel-copper alloy, tin plated copper clad steel, stainless steel, and/or aluminum. In various embodiments, EMC shielding 116 can be flat, flexible sheets of woven mesh. In other embodiments, EMC shielding 116 can be woven mesh formed into bellows that surround electronic wiring and components spanning from face plate 104 to chassis 102, allowing for expansion and contraction as face plate 104 rotates to various orientations. In one embodiment, housing 100 includes two sheets of EMC shielding 116. One sheet extends from the top of chassis 102 on the open side to the top edge of face plate 104. The second sheet extends from the bottom of chassis 102 on the open side to the bottom edge of face plate 104. As one skilled in the art will appreciate, EMC shielding 116 can be affixed to chassis 102 and face plate 104 by connecting opposite edges of EMC shielding 116 to silicone foam gaskets. In some embodiments, one gasket adheres to face plate 104 and one gasket adheres to chassis 102.

Figure 2:
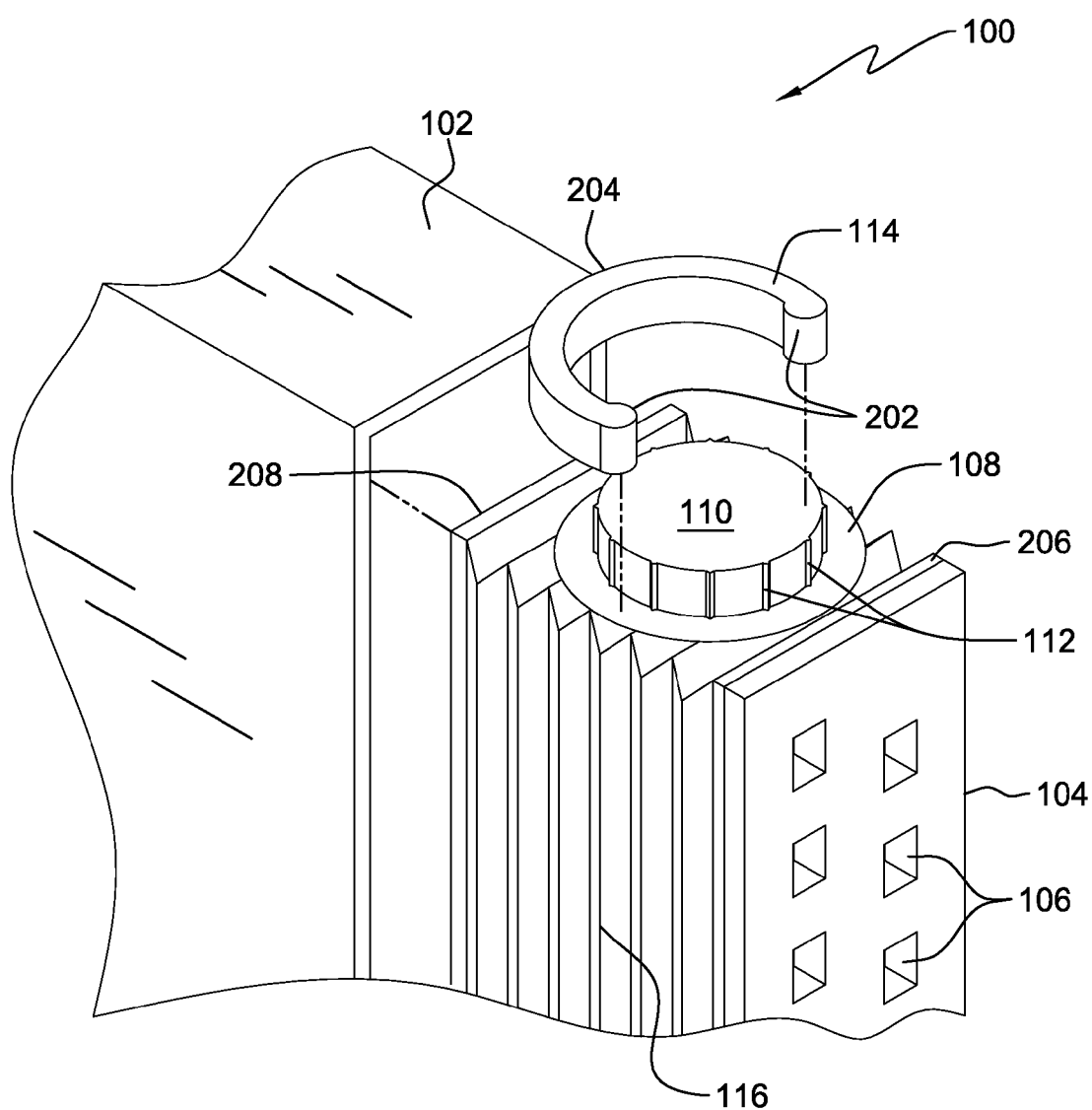
FIG. 2 is a schematic partial assembly view of the electronic device housing of FIG. 1, in accordance with an embodiment of the present invention.

FIG. 2 is a schematic partial assembly view of housing 100, in accordance with an embodiment of the present invention. FIG. 2 depicts a close up view of a hinge mechanism that allows face plate 104 to rotate to different angles with respect to chassis 102, in accordance with an embodiment of the present invention.

Clamp 114 is a semi-flexible clip that has two arms extending to form a C-clip that partially surrounds adjustment control 110. In an embodiment, each arm terminates in a protrusion, such as protrusions 202. Each of protrusions 202 extends toward the opposite arm of clamp 114. Protrusions 202 fit into gaps defined by adjustment control 110 and ridges 112, in order to hold adjustment control 110 in place. In one embodiment, the arms of clamp 114 connect to form apex 204. Apex 204 connects to the interior of chassis 102 using a fastener (e.g., glue, nails, screws, etc.). In a preferred embodiment, clamp 114 attaches to the interior of chassis 102.

Gaskets 206 and 208 form a seal between EMC shielding 116 and face plate 104 and between EMC shielding 116 and chassis 102, respectively. In some embodiments, gaskets 206 and 208 can be made from silicone foam. In other embodiments, gaskets 206 and 208 can be made from thermoplastic foam cores with nickel or copper plated woven fabric coatings. Gasket 206 provides an electromagnetic radiation seal between EMC shielding 116 and face plate 104 by adhering to face plate 104, for example, by applying an adhesive to one side of the gasket and applying the side with the adhesive to face plate 104. EMC shielding 116 connects to gasket 206, for example, by stitching the wire mesh of EMC shielding 116 to the wire mesh plating of gasket 206, spot welding EMC shielding 116 to gasket 206, or by applying an adhesive to both EMC shielding 116 and gasket 206. Similar attachment methods connect EMC shielding 116 and gasket 208. Gasket 208 attaches to the interior of chassis 102. Gasket 208 is affixed to chassis 102, for example, by applying an adhesive between gasket 208 and the interior of chassis 102, or by applying screws or bolts through the corners of gasket 208 and metal tabs attached to the interior of chassis 102 designed to receive screws or bolts. In one embodiment, EMC shielding 116 does not attach to gasket 208, but comes into contact with gasket 208 to create an electromagnetic seal, while remaining free to slide past gasket 208 as face plate 104 rotates to different orientations.

Figure 3:
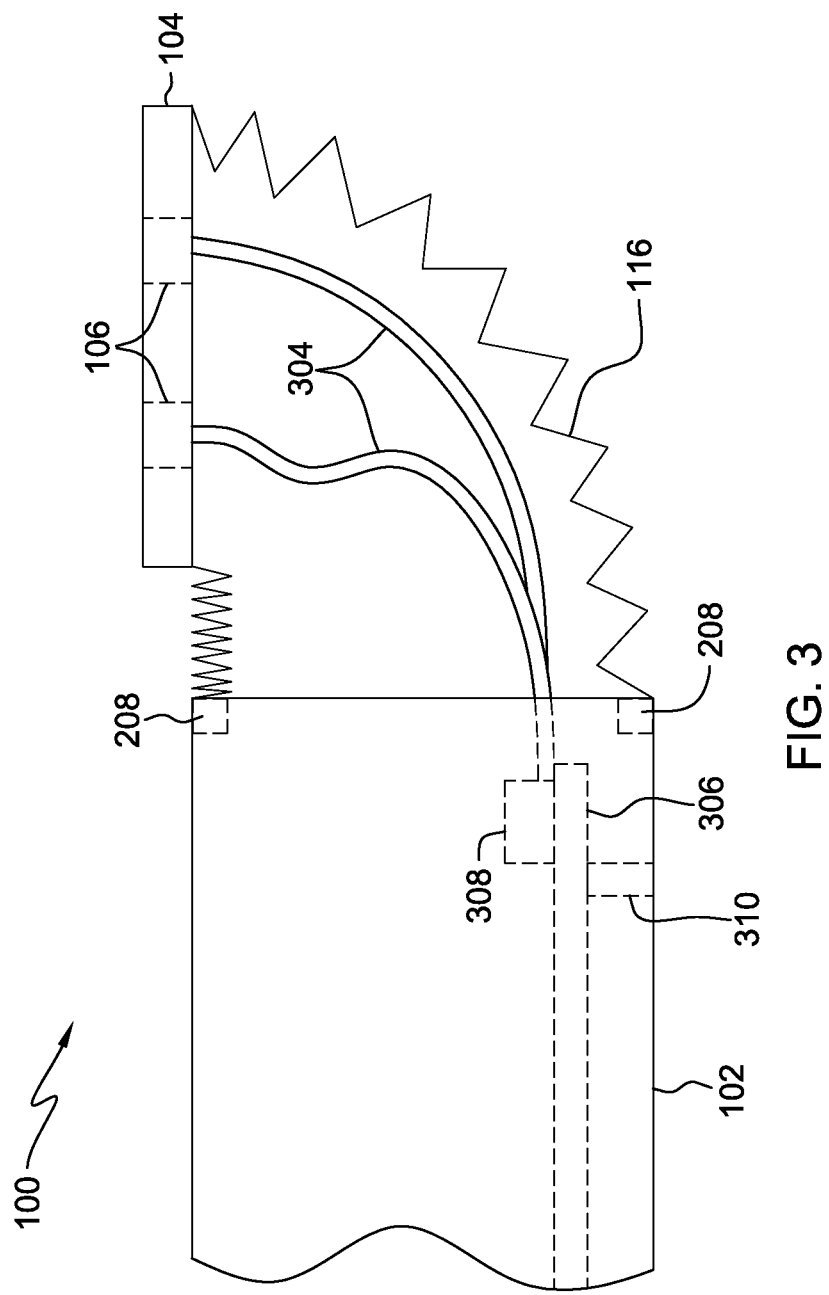
FIG. 3 is a transverse sectional view of the electronic device housing of FIG. 1, in accordance with an embodiment of the present invention.

FIG. 3 is a transverse sectional view of the electronic device housing of FIG. 1, in accordance with an embodiment of the present invention. FIG. 3 depicts housing 100 with face plate 104 set at ninety (90) degrees to the orientation of the open side of chassis 102. Housing 100 includes ports 106, flexible circuits 304, printed circuit board (PCB) 306, and PCB interface 308.

Ports 106 are electrical connection points that provide physical contact points between flexible circuits 304 and cables attached to face plate 104, via ports 106. One skilled in the art will appreciate that ports 106 can be configured to accept any electrical interface including, but not limited to, various types of Ethernet, universal serial bus (USB), and/or any other type of data port. Ports 106 physically connect with flexible circuits 304 in order to generate a continuous electrical connection between cables plugged into ports 106.

Flexible circuits 304 are patterns of flexible conductors printed onto flexible dielectric (electrical insulator) films. In various embodiments, the conductors can be copper foil that is electro-deposited onto the dielectric film or rolled copper foil. In other embodiments, the conductors can include copper alloys. In various embodiments, the flexible dielectric can include polyimide film, fluorinated ethylene propylene (FEP), and/or polyester. In general, the dielectric film can be any material that can sufficiently flex to allow face plate 104 to rotate through one-hundred eighty (180) degrees while maintaining its tensile strength and dielectric properties. Flexible circuits 304 can be single-sided, double-sided, or multi-layer circuits. Single-sided circuits include a single layer of conductive material and are useful for simple point-to-point electrical connections. Double-sided circuits include two layers of conductive material with one layer formed on each side of a single layer of substrate. Double-sided circuits provide for more efficient packaging by effectively folding a single conductive wire over on itself. Multi-layer circuits include at least two layers of insulation, separating at least three layers of conductive wiring. Multi-layer circuits improve space efficiency of the flexible circuit and allow for more complex point-to-point wiring than single-sided or double-sided wiring. Each flexible circuit 304 is long enough to extend from PCB interface 308 to the furthest possible location of port 106, to which flexible circuit 304 connects. Where port face 104 has two parallel rows of ports 106, the furthest and shortest possible locations of various ports 106 occur when port face 104 is oriented at a ninety (90) degree angle to chassis 102.

PCB 306 is a printed circuit board that includes the components that make up the electronic device stored in housing 100. In various embodiments, PCB 306 mechanically supports and electrically connects electronic components using conductive tracks, pads, and/or other features etched from copper sheets laminated onto a nonconductive substrate. PCB 306 can be single-sided, double-sided, or multi-layer. Single-sided PCBs have a single copper layer, double-sided PCBs have two copper layers separated by an insulator, and multi-layer PCBs have at least three copper layers separated by at least two insulating layers. Conductors on different layers are connected with plated through holes, called vias. PCB 306 can include components, such as capacitors, resistors, and/or other electrical components/devices, embedded in the substrate. PCB 306 is attached to chassis 102 with at least one post or peg, such as, post 310. In general, PCB 306 includes, or is electrically connected to, all of the components necessary to generate the desired functionality of the electronic device stored in housing 100, such as, a network switch, router, or server.

PCB interface 308 is an electrical connection device that provides a physical and electrical connection between flexible circuits 304 and PCB 306. PCB interface 308 can be any type of connection that routes the conductive wires in flexible circuits 304 to corresponding electrical contacts on PCB 306. For example, in the case of Ethernet connections, PCB interface 308 connects the input conductor of flexible circuits 304 to the input conductor on PCB 306 and the output wire(s) of flexible circuits 304 to corresponding output wire(s) on PCB 306. In an embodiment, PCB interface 308 is a zero insertion force (ZIF) connector.

Figure 4:
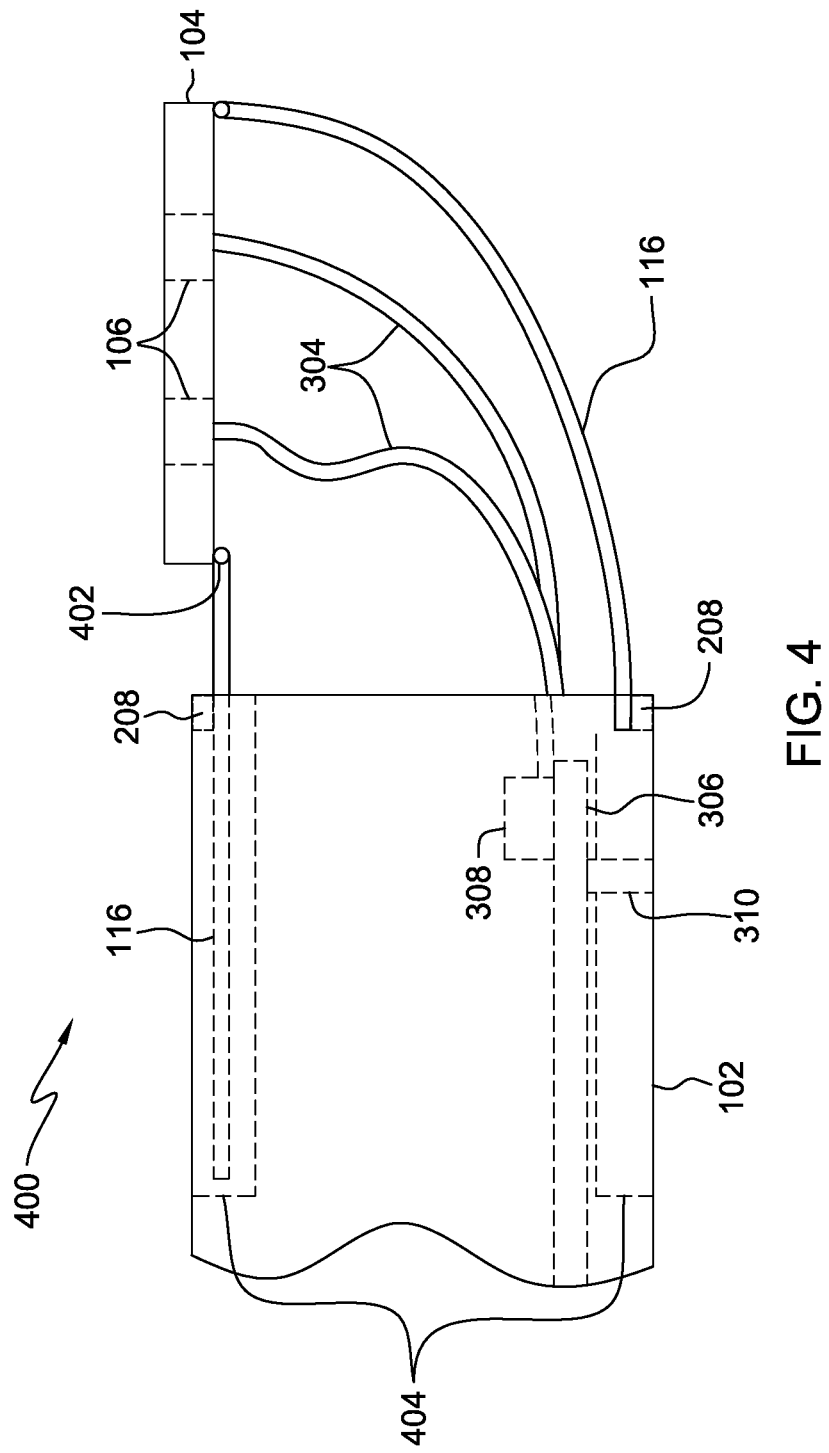
FIG. 4 is a transverse sectional view of an electronic device housing with a rotationally adjustable port face, in accordance with an embodiment of the present invention.

FIG. 4 is a transverse sectional view of an electronic device housing, generally designated 400, with a rotationally adjustable port face, in accordance with an embodiment of the present invention.

Housing 400 includes EMC shielding 116 connected to face plate 104 with hinge 402. Hinge 402 can be any type of hinge mechanism that can attach EMC shielding 116 to face plate 104 and allows face plate 104 to rotate through ninety (90) degrees, such as, a barrel hinge, flange hinge, and/or pivot hinge. Housing 400 includes shielding guide 404. Shielding guide 404 is a metal or plastic plate that is attached to chassis 102 and provides a cavity into which EMC shielding 116 slides when face plate 104 is oriented at an angle. When face plate 104 is rotated to the side opposite of EMC shielding 116, EMC shielding 116 slides out of the cavity defined by shielding guide 404, creates a seal with gasket 208 to prevent leakage of electromagnetic radiation, and flexes to create an arc of EMC shielding that extends from chassis 102 to hinge 402.

Figure 5:
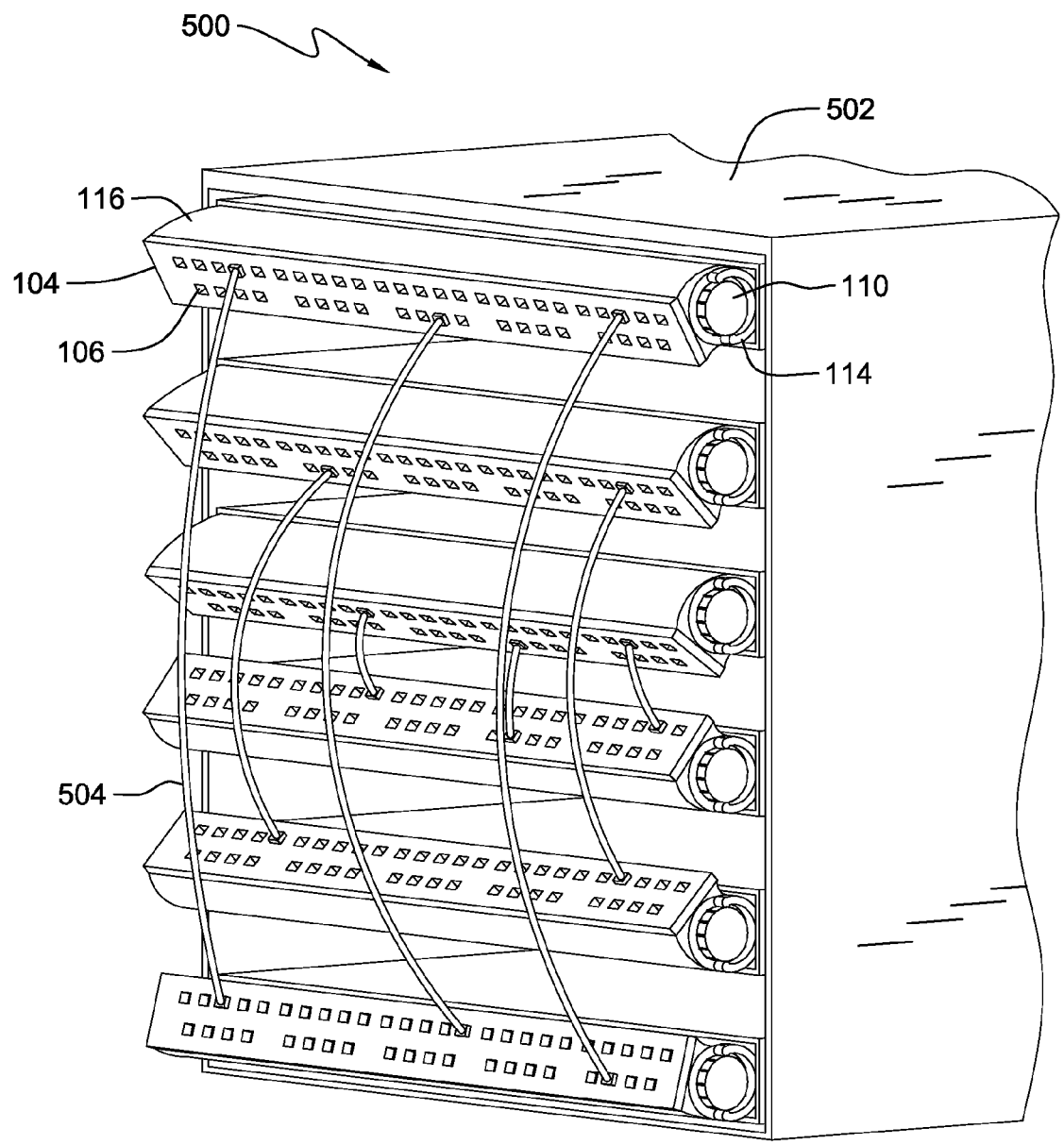
FIG. 5 is a perspective view of a rack holding multiple electronic device housings with rotationally adjustable port faces, in accordance with an embodiment of the present invention.

FIG. 5 is a perspective view of a rack holding multiple electronic device housings with rotationally adjustable port faces, in accordance with an embodiment of the present invention. Each of the depicted housings has a rotationally adjustable port face and is substantially similar to the other depicted housings. Rack 500 includes cabinet 502, which holds a plurality of electronic device housings, such as housing 100. Cabinet 502 can be any type of electronic device rack such as a floor mounted rack, wall mounted rack, open frame rack, or portable rack. Cabinet 502 includes space to insert a plurality of electronic devices, and is capable of holding at least one electronic device having a housing, such as housing 100. The plurality of housings are connected, as in a hardwire network, via cables 504 plugged into various ports 106. Face plates 104 of the various housings are adjusted to different orientations with respect to cabinet 502 depending on the location of the housing, and the location of other housings, to which the cables connect. In one embodiment, cabinet 502 includes a mechanism for automatically adjusting the angle of face plate 104 for each housing stored in cabinet 502 based on the slot into which each housing is inserted.

Figure 6:
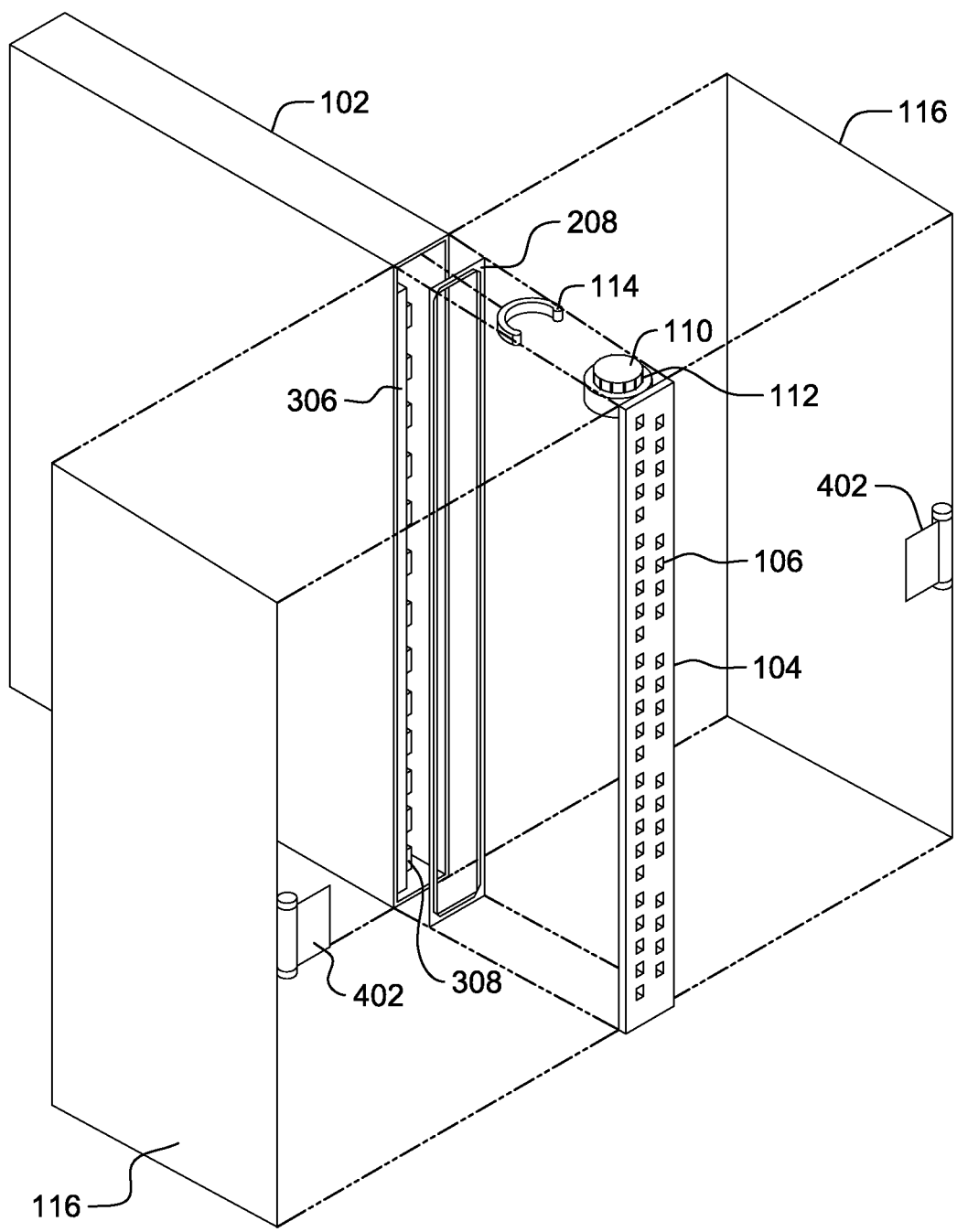
FIG. 6 is a schematic partial assembly view of the electronic device housing of FIG. 4, in accordance with an embodiment of the present invention.

FIG. 6 is a schematic partial assembly view of an electronic device housing, in accordance with an embodiment of the present invention. Gasket 208 attaches to the interior of chassis 102. Clamp 114 attaches to the interior of chassis 102. EMC shielding 116 attaches to the sides of face plate 104 using a hinge mechanism, such as hinge 402, and slides inside of gasket 208, forming an electromagnetic radiation seal with the interior edges of gasket 208. Adjustment control 110 is affixed to the side of face plate 104 facing chassis 102. Adjustment control 110 fits inside clamp 114. Clamp 114 applies pressure to adjustment control 110 to hold adjustment control 110 and face plate 104 in a particular orientation until a torque is applied to face plate 104 or adjustment control 110, at which point the arms of clamp 114 expand to allow adjustment control 110 and face plate 104 to rotate until the arms of clamp 114 contract into the next gaps defined by adjustment control 110 and ridges 112.

The terminology used herein is for the purpose of describing particular embodiments only, and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Having described preferred embodiments for electronic device housings with rotationally adjustable port faces (which are intended to be illustrative and not limiting), it is noted that modifications and variations may be made by persons skilled in the art in light of the above teachings. All structural and functional equivalents to the elements of the various embodiments described throughout this disclosure that are known, or later come to be known, to those of ordinary skill in the art are expressly incorporated herein by reference and intended to be encompassed by the invention. It is, therefore, to be understood that changes may be made in the particular embodiments disclosed which are within the scope of the present invention as outlined by the appended claims.

What is claimed is:

1. An apparatus allowing for an adjustable face plate, comprising:
   a face plate;
   an adjustment device affixed to the face plate, wherein the adjustment device includes a plurality of ridges formed thereon to define a plurality of gaps, and wherein the adjustment device is capable of rotating about an axis; and
   a clamp affixed to an electronic device chassis, having a first arm contacting the adjustment device in a first gap of the plurality of gaps, and allowing for rotation of the adjustment device about the axis from the first gap to a second gap of the plurality of gaps.

2. The apparatus of claim 1, further comprising:
   a sheath of electromagnetic compatibility shielding, having a first edge and a second edge;
   a first gasket, affixed to the face plate and affixed to the first edge of the sheath of electromagnetic compatibility shielding; and
   a second gasket, affixed to the chassis and affixed to the second edge of the sheath of electromagnetic compatibility shielding.

3. The apparatus of claim 2, wherein the sheath comprises a bellows formed from woven metallic mesh.

4. The apparatus of claim 2, wherein the sheath of electromagnetic compatibility shielding comprises woven nickel-copper alloy mesh.

5. The apparatus of claim 2, wherein the first and second gaskets comprised thermoplastic foam cores having copper plated woven fabric coatings.

6. The apparatus of claim 2, wherein the first and second gaskets comprised thermoplastic foam cores having nickel plated woven fabric coatings.

7. The apparatus of claim 1, further comprising:
   a sheath of electromagnetic compatibility shielding comprising a flexible sheet of woven metallic mesh having a first edge and a second edge, wherein the first edge attaches to at least one hinge, and wherein the at least one hinge is affixed to the face plate; and
   a gasket affixed to the electronic device chassis and affixed to the second edge of the sheath of electromagnetic compatibility shielding.

8. The apparatus of claim 1, further comprising:
   a sheath of electromagnetic compatibility shielding comprising a flexible sheet of woven metallic mesh having a first edge and a second edge, wherein the first edge attaches to at least one hinge, and wherein the at least one hinge is affixed to the face plate; and
   a gasket, having a hole formed therethrough and attached to the chassis, wherein the second edge of the sheath of electromagnetic compatibility shielding is inserted into the hole and the sheath of electromagnetic shielding contacts the gasket to allow for relative motion between the gasket and the sheath of electromagnetic compatibility shielding.

9. The apparatus of claim 8, further comprising:
   one or more guides affixed to the chassis, wherein the sheath of electromagnetic compatibility shielding can slide into the guides.

10. The apparatus of claim 1, further comprising:
    a plurality of electronic connection ports formed through the face plate;
    a printed circuit board affixed to the chassis; and
    a plurality of flexible electronic circuits connecting the plurality of electronic connection ports to the printed circuit board.

11. The apparatus of claim 1, wherein the clamp further comprises a second arm, connected to the first arm at an apex, and wherein the apex is connected to the electronic device chassis.

12. The apparatus of claim 11, wherein the first arm of the clamp has a first protrusion formed on a side of the first arm, and wherein the second arm of the clamp has a second protrusion formed on a side of the second arm, and wherein the first protrusion extends from the first arm toward the second protrusion.

13. The apparatus of claim 11, wherein the clamp is semi-flexible to allow for flexing of the first and second arm away from adjustment device to facilitate rotation of the adjustment device.

14. The apparatus of claim 13, wherein the first and second protrusions apply pressure to the adjustment device by inserting into one or more of the plurality of gaps.

15. The apparatus of claim 13, wherein the semi-flexible clamp is a C-clamp.

16. An apparatus allowing for an adjustable face plate, comprising:
    a face plate;
    an adjustment device affixed to the face plate, wherein the adjustment device includes a plurality of ridges formed thereon to define a plurality of gaps, and wherein the adjustment device is capable of rotating about an axis; and
    a clamp connected to an electronic device chassis by way of a track slide, wherein the clamp has a first arm contacting the adjustment device in a first gap of the plurality of gaps and allowing for rotation of the adjustment device about the axis from the first gap to a second gap of the plurality of gaps.

17. The apparatus of claim 16, further comprising:
a sheath of electromagnetic compatibility shielding, having a first edge and a second edge;
a first gasket, affixed to the face plate and affixed to the first edge of the sheath of electromagnetic compatibility shielding; and
a second gasket, affixed to the chassis and affixed to the second edge of the sheath of electromagnetic compatibility shielding.

18. The apparatus of claim 16, further comprising:
a sheath of electromagnetic compatibility shielding comprising a flexible sheet of woven metallic mesh having a first edge and a second edge, wherein the first edge attaches to at least one hinge, and wherein the at least one hinge is affixed to the face plate; and
a gasket affixed to the electronic device chassis and affixed to the second edge of the sheath of electromagnetic compatibility shielding.

19. The apparatus of claim 16, further comprising:
a sheath of electromagnetic compatibility shielding comprising a flexible sheet of woven metallic mesh having a first edge and a second edge, wherein the first edge attaches to at least one hinge, and wherein the at least one hinge is affixed to the face plate; and
a gasket, having a hole formed therethrough and attached to the chassis, wherein the second edge of the sheath of electromagnetic compatibility shielding is inserted into the hole and the sheath of electromagnetic shielding contacts the gasket to allow for relative motion between the gasket and the sheath of electromagnetic compatibility shielding.

20. The apparatus of claim 16, wherein the clamp further comprises a second arm, connected to the first arm at an apex, and wherein the apex is connected to the electronic device chassis.

* * * * *